(12) United States Patent
Novak (10) Patent No.: US 11,022,255 B2
(45) Date of Patent: Jun. 1, 2021

(54) REFLECTOR LAMP WITH FLEX DLE

(71) Applicant: LEDVANCE GmbH, Garching bei München (DE)

(72) Inventor: Krisztian Novak, Regensburg (DE)

(73) Assignee: LEDVANCE GMBH, Garching bei Munchen (DE)

( * ) Notice: Subject to any disclaimer, the term of this patent is extended or adjusted under 35 U.S.C. 154(b) by 0 days.

(21) Appl. No.: 16/040,158

(22) Filed: Jul. 19, 2018

(65) Prior Publication Data

US 2019/0032859 A1   Jan. 31, 2019

(30) Foreign Application Priority Data

Jul. 26, 2017   (DE) .......................... 102017116924.5

(51) Int. Cl.
| | |
|---|---|
| *F21K 9/232* | (2016.01) |
| *F21K 9/278* | (2016.01) |
| *H05K 1/02* | (2006.01) |
| *F21K 9/238* | (2016.01) |
| *F21V 23/00* | (2015.01) |
| *F21Y 107/70* | (2016.01) |
| *F21Y 115/10* | (2016.01) |

(52) U.S. Cl.
CPC ............. *F21K 9/232* (2016.08); *F21K 9/238* (2016.08); *F21K 9/278* (2016.08); *F21V 23/005* (2013.01); *F21V 23/006* (2013.01); *H05K 1/0278* (2013.01); *F21Y 2107/70* (2016.08); *F21Y 2115/10* (2016.08); *H05K 2201/10106* (2013.01)

(58) Field of Classification Search
CPC ........ F21K 9/232; F21K 9/238; F21V 23/005; F21V 29/22; F21V 29/70; F21V 29/87
USPC .......................................... 362/84, 235, 373
See application file for complete search history.

(56) References Cited

U.S. PATENT DOCUMENTS

| | | | | |
|---|---|---|---|---|
| 7,086,756 | B2 * | 8/2006 | Maxik ....................... | F21K 9/90 |
| | | | | 362/249.04 |
| 8,371,722 | B2 * | 2/2013 | Carroll ...................... | F21V 3/00 |
| | | | | 362/235 |
| 9,933,148 | B2 * | 4/2018 | Brandes .................... | F21K 9/64 |
| 10,247,364 | B2 * | 4/2019 | Cao .......................... | F21K 9/232 |
| 2004/0008525 | A1 * | 1/2004 | Shibata .................... | F21K 9/232 |
| | | | | 313/271 |
| 2009/0302730 | A1 * | 12/2009 | Carroll ...................... | F21V 3/02 |
| | | | | 313/46 |
| 2010/0239953 | A1 * | 9/2010 | Gerding ............... | H01M 8/0276 |
| | | | | 429/512 |

(Continued)

FOREIGN PATENT DOCUMENTS

| | | |
|---|---|---|
| DE | 102010030702 A1 | 10/2011 |
| WO | 2010040645 A2 | 4/2010 |
| WO | 2016005069 A1 | 1/2016 |

*Primary Examiner* — Tung X Le
(74) *Attorney, Agent, or Firm* — Hayes Soloway PC (57) ABSTRACT

A light fixture includes a printed circuit board received in a housing. At least one light-emitting diode is mounted on a first region of the printed circuit board and an electronic driver is mounted on a second region of the printed circuit board. The first region is connected to the second region by a deformation zone of the printed circuit board formed in one-piece with the first region and the second region. The first region and the second region are electrically contacted with one another through the deformation zone.

20 Claims, 6 Drawing Sheets

(56) References Cited

U.S. PATENT DOCUMENTS

| | | | |
|---|---|---|---|
| 2013/0020941 A1 | 1/2013 | Breidenassel et al. | |
| 2013/0229801 A1* | 9/2013 | Breidenassel | F21V 3/02 |
| | | | 362/235 |
| 2015/0055355 A1* | 2/2015 | Huang | F21K 9/27 |
| | | | 362/382 |
| 2015/0109758 A1* | 4/2015 | Allen | F21V 3/061 |
| | | | 362/84 |
| 2016/0084490 A1* | 3/2016 | Davis | F21K 9/23 |
| | | | 362/373 |
| 2016/0230939 A1* | 8/2016 | Van Hout | F21V 3/061 |
| 2018/0363857 A1* | 12/2018 | Ren | F21V 19/004 |

* cited by examiner

REFLECTOR LAMP WITH FLEX DLE

CROSS-REFERENCE TO RELATED APPLICATIONS AND PRIORITY

This patent application claims priority from German Patent Application No. 102017116924.5 filed Jul. 26, 2017, which is herein incorporated by reference in its entirety.

TECHNICAL FIELD

The present invention relates to a light fixture, in particular a light fixture which comprises at least one light-emitting diode, and a method for producing a light fixture.

TECHNICAL BACKGROUND

It is known in the prior art to provide light fixtures, such as reflector lamps, with one or more lighting elements, such as light-emitting diodes, which are electrically connected to an electronic driver. In order to achieve a space-saving arrangement, the lighting element or elements is/are arranged for example on a lighting element circuit board, a so-called "light engine". The lighting elements on the lighting element circuit board are electrically conductively connected to a printed circuit board or circuit board, on which the electronic driver is arranged, by means of contact pins or conductor wires.

Due to the separate arrangement of the lighting element circuit board and the electronic driver circuit board these boards are substantially thermally insulated from one another, so that heating of one of the two circuit boards does not cause heating of the respective other circuit board. Moreover, as a result a great freedom of design is enabled with regard to the structure of the light fixture. However, the provision of lighting elements on a circuit board and the electronic driver on a further circuit board results in a complicated structure of the light fixture and higher production costs, since two separate circuit boards are to be produced and are to be connected for electrical contact. Due to the plurality of parts and their connections, not only the complexity of the structure of the light fixture increases but also the total weight thereof.

In order to counteract the aforementioned disadvantages, light fixtures are known in which the lighting elements and the electronic driver are provided on a common circuit board, a so-called "driver light engine". In this case the lighting elements are generally arranged on a first side of the circuit board and the electronic driver is arranged on the opposite side of the circuit board. WO 2016 005 069 A1 shows such a light fixture in the form of a semiconductor lamp.

The provision of a "driver light engine" in a light fixture actually reduces the number of parts and thus the complexity of the structure of the light fixture relative to light fixtures with a separate lighting element circuit board and electronic driver circuit board. Furthermore, however, there is a high manufacturing expenditure, since the circuit board is to be provided from both sides with components. Moreover, a thermal coupling between the lighting elements and electronic driver is produced by combining the separate circuit boards on a common circuit board. Thus, the lighting elements and the electronic driver heat one another up. In order to take this increased heating into account, enlarged cooling elements or cooling element assemblies of complicated construction should be provided, which increase the complexity and the weight of the light fixture as well as the production costs thereof.

SUMMARY OF THE INVENTION

Starting from the known prior art, it is an object of the present invention to provide an improved light fixture as well as a corresponding method for production of such a light fixture.

This object is achieved by a light fixture and a method for production of the light fixture with the features of the independent claims. Advantageous further embodiments are apparent from the subordinate claims, the description and the drawings.

Accordingly, a light fixture is proposed, comprising a printed circuit board received in a housing, at least one light-emitting diode mounted on a first region of the printed circuit board and an electronic driver mounted on a second region of the printed circuit board. According to the invention the first region is connected to the second region by means of a deformation zone of the printed circuit board formed in one-piece with the first region and the second region, wherein the first region and the second region are electrically contacted with one another by means of the deformation zone.

Due to the fact that the first region is connected to the second region by means of a deformation zone of the printed circuit board formed in one-piece with the first region and the second region, wherein the first region and the second region are electrically contacted with one another by means of the deformation zone, a light fixture with a simple construction and low manufacturing costs can be provided. Since the electrical contact between at least one light-emitting diode and the electronic driver is provided by means of the connection zone, additional parts are not necessary for electrical contact. Moreover, the first region and the second region are at least partially thermally isolated from one another by means of the connection zone, so that reciprocal warming of at least one light-emitting diode and the electronic driver can be reduced or even completely avoided.

For electrically contacting the first region with the second region by means of the deformation region conductive tracks are preferably arranged on the deformation region. The conductive tracks preferably extend on a continuous surface of the printed circuit board which extends over the first region, the deformation zone and the second region. In this case at least one light-emitting diode and the electronic driver are preferably electrically conductively connected by means of solder points to the conductive tracks.

The deformation zone is preferably constructed so that a position of the second region relative to the first region can be changed by a deformation of the deformation zone. In other words, a flexible printed circuit board is provided. The deformation zone can be formed as a discrete region between the first region and the second region of the one-piece printed circuit board or extend at least partially into the first region and/or the second region. According to a further embodiment, the deformation zone extends over substantially the entire printed circuit board.

According to a preferred embodiment the second region is positioned in an installation position in the housing in such a way that the second region and the first region enclose an angle of greater than 0° to less than 360°, preferably greater than 0° to 270°, particularly preferably greater than 0° to 180°. As a result, only a small installation space has to be provided for the printed circuit board. Moreover, the light fixture can be designed to be small when viewed radially with respect to a longitudinal extent of the light fixture.

According to a further preferred embodiment, at least one light-emitting diode and the electronic driver are arranged on the same side of the printed circuit board with respect to a developed projection of the printed circuit board on an imaginary plane. In other words, at least one light-emitting diode and the electronic driver are located on one surface side of the printed circuit board, wherein the printed circuit board is defined by two surface sides and a wall thickness. As a result, during manufacture of the light fixture it is possible that at least one light-emitting diode and the electronic driver are mounted on the printed circuit board from a common side. Therefore, in contrast to conventional "driver light engines", in which the light-emitting diode and the driver are located on opposite sides of the printed circuit board, the printed circuit board is not to be equipped from both sides. Consequently, a rotation of the printed circuit board which was previously necessary for this, or the provision of a complicated device which enables equipping of printed circuit boards on both sides, can be omitted.

Alternatively, at least parts of the electronic driver can be arranged on the other side of the printed circuit board. By means of a deformation of the deformation zone, the second area can then preferably be positioned in such a way that a space available in the interior of the light fixture is optimally utilized.

The term "developed projection" is understood here as the spread of a surface in one plane. Therefore, the developed projection of the printed circuit board should be understood to mean that, starting from a point on one side of the printed circuit board, this side or surface side is spread onto an imaginary plane. For example, starting from a point on one side of the first region, the conductive track can spread over the deformation zone and the second region on the imaginary plane. In the developed-projection state the conductive track has a planar, substantially two-dimensional extent.

According to a further preferred embodiment, a position of the second region in relation to the first region can be changed by bending and/or stretching of the deformation zone. In this way, a greater freedom of design is achieved with regard to the structure of the light fixture or the arrangement of the individual components in the housing. In particular, a position or orientation of the electronic driver relative to at least one light-emitting diode can be provided in such a way that only a small installation space is necessary in the housing.

A particularly advantageous configuration and a simple assembly of the light fixture can be achieved if, according to a further preferred embodiment, the second region is able to pivot by a deformation of the deformation zone relative to the first region.

According to a further preferred embodiment the first region and the second region can form an angle of greater than 0° to less than 360°, preferably greater than 0° to 270°, particularly preferably greater than 0° to 180°, due to a deformation of the deformation zone. In this way it is possible to position the electronic driver in substantially any orientation in the housing, wherein the first region having the light-emitting diodes can remain in a position in which the light-emitting diodes are optimally positioned in relation to a radiation area of the light fixture.

In an advantageous further development, the assembly of the light fixture the electronic driver can be pivoted by pivoting of the second region out of a position plane-parallel to the first region into a pivoted installation position, wherein the electronic driver in the installation position is preferably positioned below the light-emitting diode, therefore in an orientation which faces away from the side of at least one light-emitting diode.

In a further preferred embodiment, the second region is movable/displaceable, preferably displaceable in a parallel manner, by a deformation of the deformation zone relative to the first region.

In order to achieve a particularly flexible configuration of the printed circuit board with a particularly low manufacturing expenditure, according to a further preferred embodiment, the deformation zone can have a wall thickness which is smaller than a wall thickness of the first region and/or a wall thickness of the second region, wherein the deformation zone is preferably of thin-walled construction by comparison with the first region and/or second region, wherein the deformation zone is preferably constructed as a film hinge.

The term "thin-walled" here is understood to mean that the section designated as "thin-walled" has a wall thickness which is smaller by a multiple than a wall thickness of the comparison section. The section designated as "thin-walled" preferably has a wall thickness which is 2 times, 3.3 times, 4 times, 6 times, 8 times, 10 times, 12 times or 20 times smaller than the wall thickness of the comparison section.

According to a further preferred embodiment, in order to prevent at least one light-emitting diode and the electronic driver from heating one another in operation of the light fixture, for example by a thermal conduction from the light fixture via the first region to the second region and to the electronic driver, the deformation zone can at least partially provide a thermal insulation between the first region and the second region.

According to a further preferred embodiment, if the second region is arranged in such a way that shading at least one light-emitting diode by the electronic driver is prevented, the light fixture can use the radiant output of at least one light-emitting diode in the best possible manner.

According to a further preferred embodiment, a particularly compact and simple structure of the light fixture can be achieved when the second region is installed in a position in the housing towards a base of the light fixture. The electronic driver is therefore arranged offset relative to at least one light-emitting diode in the direction towards the base.

According to a further preferred embodiment, the second region is retained in the installation position by at least one contact element, preferably a contact wire, a contact pin and/or a part of the housing. As a result, a particularly simple structure can be achieved, since additional parts for positioning and fixing of the second region can be omitted.

A further simplified structure can be achieved, according to a further preferred embodiment, if the second region in the installation position is pressed against at least one contact element due to a resetting tension of the deformation zone.

The above-mentioned object is also achieved by the method according to the independent claim 14. Accordingly a method for producing a light fixture according to one of the preceding embodiments is proposed, comprising the steps of providing a preferably planar printed circuit board, which has conductive tracks at least on one side, with a first region, a second region and a deformation zone which is connected integrally to the first region and the second region and which is arranged between the first region and the second region, arranging at least one light-emitting diode in the first region of the printed circuit board, arranging an electronic driver, which is connected by means of the conductive tracks to at least one light-emitting diode, on the second region of the printed circuit board, deforming the deformation zone of the printed circuit board in such a way that the first region and the second region enclose an angle of greater than 0° to 180°, and inserting the deformed printed circuit board into a housing of the light fixture.

In this way the light fixture can have a simple construction and simultaneously at least one light-emitting diode and the electronic driver are at least partially thermally isolated from one another.

According to a preferred embodiment, it has proved particularly advantageous if the printed circuit board is planar in an initial state. Mounting at least one light-emitting diode and the electronic driver preferably takes place in the planar initial state. As a result, mounting can take place particularly simply. The printed circuit board no longer has to be accessible from both sides for mounting at least one light-emitting diode and the electronic driver. It is no longer necessary to turn the printed circuit board in an apparatus for mounting the printed circuit board and/or to form a complex apparatus which can equip the printed circuit board with conductive tracks on both sides.

Due to the deformation of the deformation region the printed circuit board can be brought out of the planar initial state into a three-dimensional installed state or an installation position, so that an installation space predetermined by the shape of the housing of the light fixture can be utilized in the best possible manner.

Furthermore, the corresponding advantages mentioned with regard to the preferred embodiments of the light fixture are achieved by the method.

In a preferred further embodiment, at least one light-emitting diode and the electronic driver are arranged on the same side of the printed circuit board and/or at least parts of the electronic driver are arranged on the other side of the printed circuit board.

BRIEF DESCRIPTION OF THE DRAWINGS

Preferred further embodiments of the invention are explained in greater detail by the following description of the drawings. In the drawings.

DETAILED DESCRIPTION OF PREFERRED EXEMPLARY EMBODIMENTS

Preferred exemplary embodiments are described below with reference to the drawings. In this case elements which are the same, similar, or act in the same way are provided with identical reference numerals in the different drawings, and repeated description of these elements is partially omitted in order to avoid redundancies.

Figure 1:
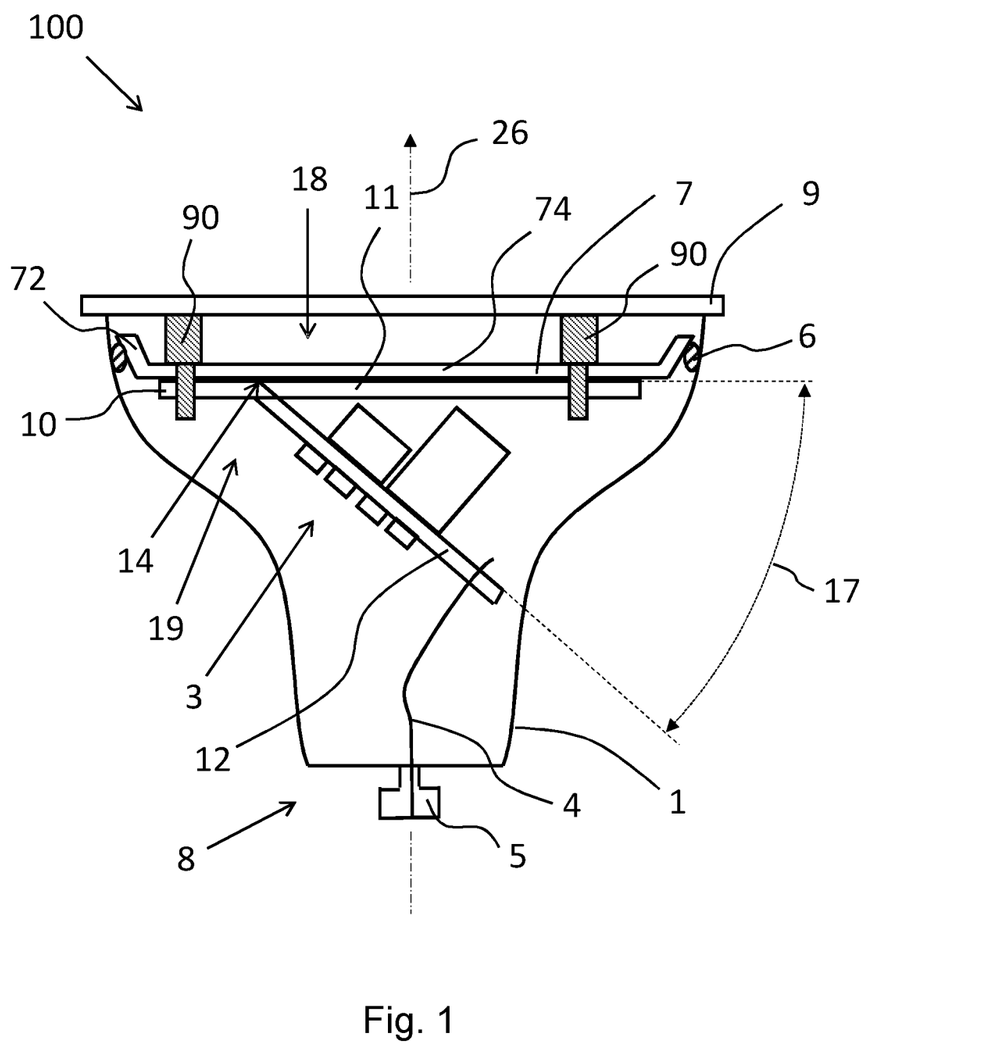
FIG. 1 shows schematically a sectional view of a light fixture according to a first embodiment.

FIG. 1 shows schematically a sectional view of a light fixture 100 according to a first embodiment. The light fixture 100 comprises a housing 1 which has, when viewed in the longitudinal extent 26 of the light fixture 100, a base 8 on which contact pins 5 are arranged. The housing 1 is covered relative to the base 8 by means of a lens 9. The light fixture 100 also has a printed circuit board 10 comprising a first region 11 which extends substantially on a plane perpendicular to the longitudinal extent 26. The printed circuit board 10 further comprises a second region 12, which is inclined relative to the first region 11 by an angle 17. The second region likewise extends substantially on one plane, wherein this plane accordingly encloses the angle 17 with the plane defined by the first region 11. The first region 11 and the second region 12 are connected in one-piece by means of a deformation zone 14. The printed circuit board 10 is therefore formed by the first region 11, the deformation zone 14 and the second region 12 in one-piece. The first region 11 is thermally conductively connected to a substantially plate-shaped base surface 74 of a cooling element 7. Furthermore, pins 90 are provided, by means of which the lens 9, the cooling element 7 and the first region 11 of the printed circuit board 10 are fixedly connected by a hot pressing process. For fastening of the assembly thus produced to the housing 1, the cooling element 7 is connected, on a collar 72, by means of a thermally conductive adhesive 6 to the housing 1.

The first region 11 has a plurality of light-emitting diodes (not shown), which are arranged on a first side 18 of the printed circuit board 10. Because of the arrangement of the first region 11 in the housing 1, the light-emitting diodes have a maximum radiation intensity parallel to the longitudinal extent 26, therefore in the direction of the lens 9.

On the first side 18 of second region 12 on the printed circuit board 10, an electronic driver 3 is connected to the plurality of light-emitting diodes by means of conductive tracks (not shown) arranged on the first side 18 of the printed circuit board 10. The conductive tracks therefore extend on the first side 18 of the printed circuit board 10 from the first region 11 via the deformation zone 14 to the second region 12.

Alternatively, the electronic driver 3 and/or conductive tracks can also be arranged on a second side 19 of the printed circuit board 10.

For the external current supply, the second region 12 or the electronic driver 3 is connected by means of contact wires 4 to the contact pins 5 of the light fixture 100.

The second region 12 is inclined relative to the first region 11 in such a way that the electronic driver 3, arranged on the first side 18, is positioned below the cooling element 7 with respect to the longitudinal extent 26.

Figure 2:
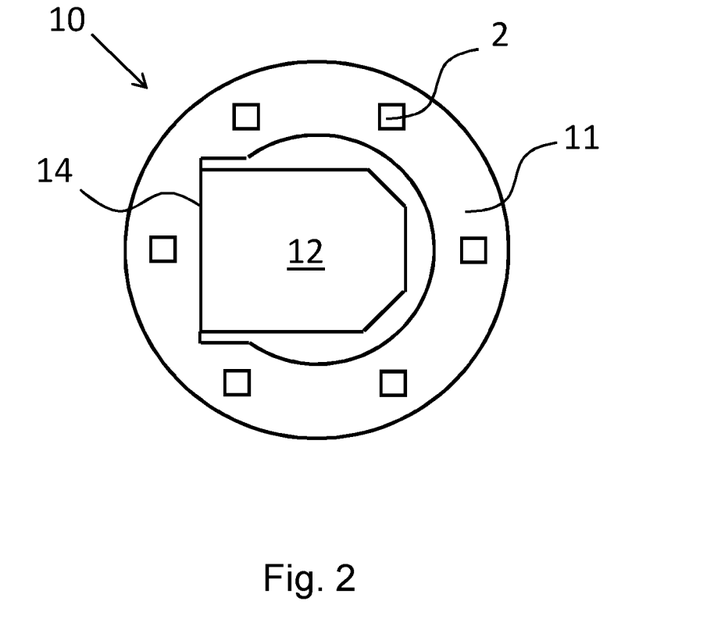
FIG. 2 shows schematically a plan view from a first side of a printed circuit board of the light fixture according to FIG. 1.

FIG. 2 shows schematically a plan view from the first side 18 of the printed circuit board 10 of the light fixture 100 according to FIG. 1. The first region 11 is substantially annular. The light-emitting diodes 2 are arranged on the first region 11 with a regular spacing in the circumferential direction. The second region 12, which is connected to the first region 11 by means of the deformation zone 14 formed as a film hinge extends inside the annular first region 11.

Figure 3:
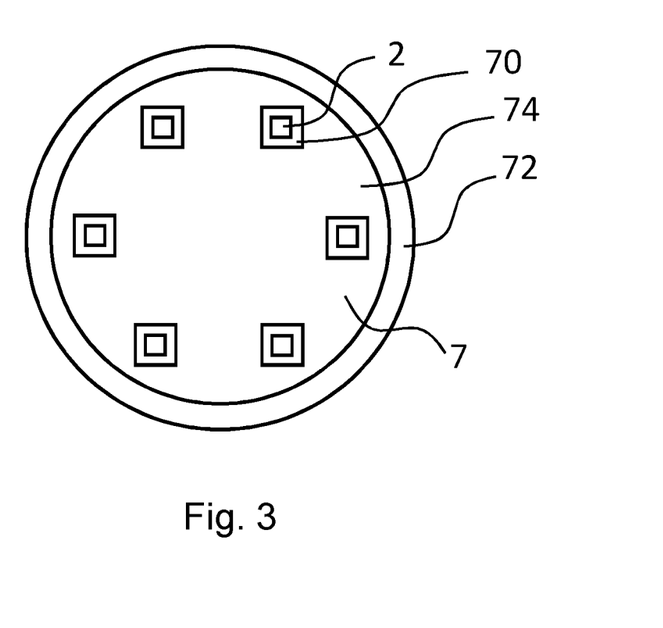
FIG. 3 shows schematically a plan view from the first side of a cooling element and the printed circuit board according to FIG. 1.

FIG. 3 shows schematically a plan view from the first side 18 of the cooling element 7 and the printed circuit board 10 according to FIG. 1. The cooling element 7 has cutouts 70 which are arranged corresponding to the arrangement of the light-emitting diodes 2 on the printed circuit board 10. As a result, in the assembled state of the light fixture 100, on the one hand, a contact over a large surface area between the first region 11 of the printed circuit board 10 and the base surface 74 of the cooling element 7 is made possible, and on the other hand, the light-emitting diodes 2 are not shielded by the cooling element 7, so that their entire radiated power is available.

Figure 4:
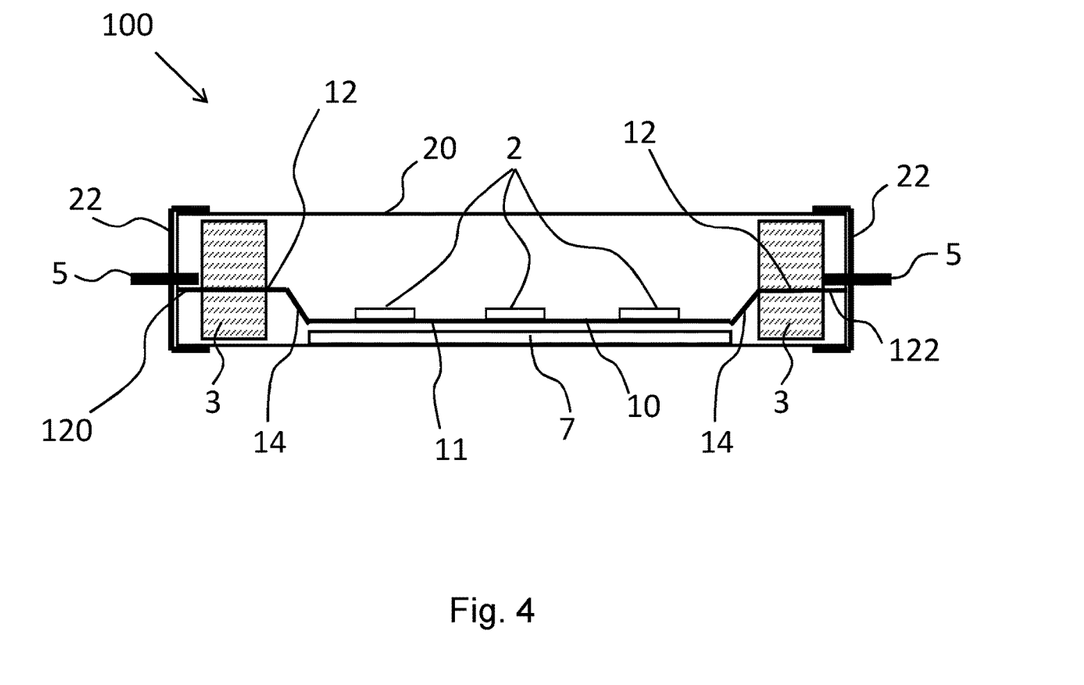
FIG. 4 shows schematically a sectional view of a light fixture according to a further embodiment.

FIG. 4 shows schematically a sectional view of a light fixture 100 according to a further embodiment. The light fixture 100 has a substantially transparent cylindrical tube 20, which is provided on its end faces with end caps 22 comprising contact pins 5.

A printed circuit board 10 is arranged in the tube 20. The second region 12 is divided into a first part 120 and a second part 122, wherein the first part 120 is arranged at one end of the tube 20 and is electrically conductively connected to the contact pins 5 there and the second part 122 is arranged at the other end of the tube 20 and is electrically conductively connected to the contact pins 5 there. The components of the electronic driver 3 are distributed over the two parts 120, 122 of the second region 12.

The first region 11 of the printed circuit board 10 which has a plurality of light-emitting diodes 2 is provided in the center of the two parts 120, 122 of the second region 12 and is connected in one-piece by means of deformation zones 14 in each case to a part 120, 122 of the second region 12. In its installation position, as illustrated in FIG. 4, the first region 11 is out of an initial state, in which the first region 11 and the second region were arranged plane-parallel, arranged offset parallel to the first region 11 in the tube 20 by stretching of the deformation zones 14, so that the first region 11 is in contact with a cooling element 7 arranged on the tube 20.

Figure 5:
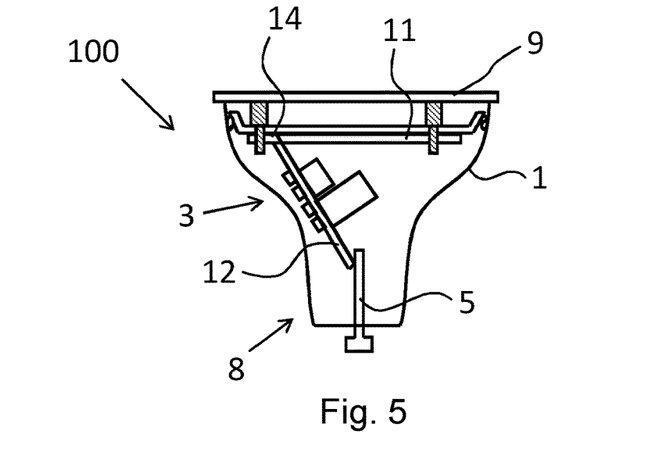
FIG. 5 shows schematically a sectional view of a light fixture in a further embodiment.
Figure 6:
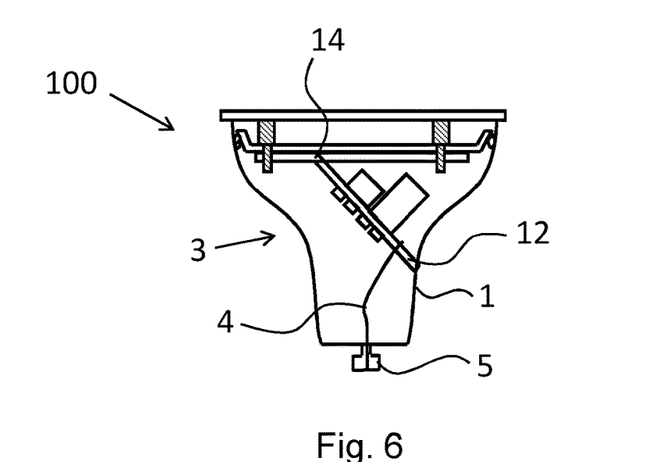
FIG. 6 shows schematically a sectional view of a light fixture in a further embodiment.
Figure 7:
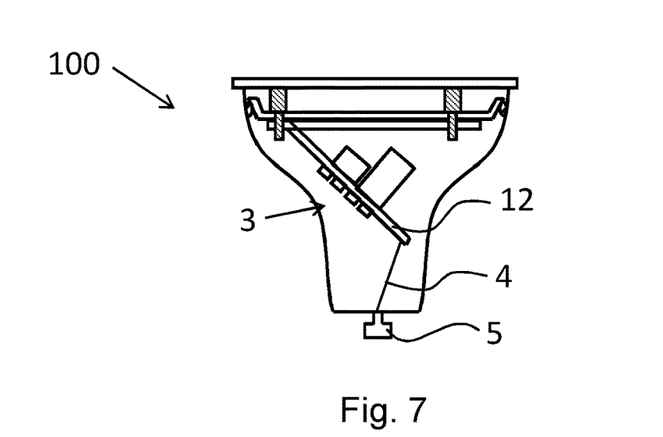
FIG. 7 shows schematically a sectional view of a light fixture in a further embodiment.

FIGS. 5 to 7 show schematic sectional views of light fixtures 100 according to further embodiments. The light fixtures 100 according to FIGS. 5 to 7 correspond substantially to the light fixture according to FIG. 1.

In the light fixture 100 according to FIG. 5 the contact pins 5 extend into the interior of the housing 1, so that there is a direct contact between the second region 12 and the contact pins 5. The second region 12 is pivoted in the direction of the base 8 by resilient bending of the deformation zone 14 and presses due to the resetting tension present in the deformation zone 14 in the direction of the lens 9 against the contact pins 5, so that there is a permanent electrically conductive contact between the contact pins 5 and the second region 12 or an electrical contacting on the second region 12. The second region 12 is therefore retained in its installation position by the contact pins 5.

FIG. 6 shows schematically a sectional view of the light fixture 100 according to FIG. 5, wherein the second region 12 leans against an inner wall of the housing 1 and is thereby fixed in its installation position. For electrical contacting the second region 12 is connected to the contact pins 5 in each case by means of contact wires 4.

FIG. 7 shows schematically a sectional view of the light fixture 100 according to FIG. 6, wherein the second region 12 is fixed directly by the contact wires 4 in its installation position.

Figure 8:
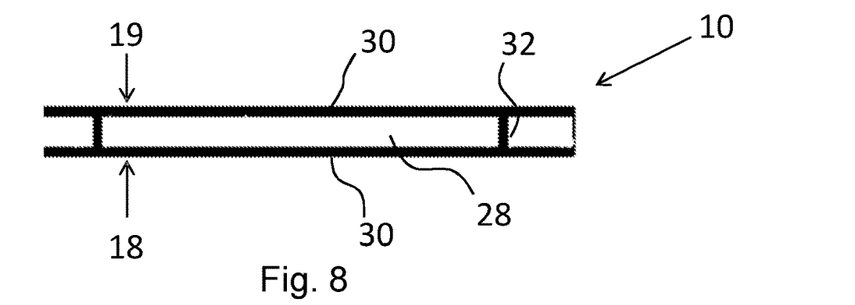
FIG. 8 shows schematically a sectional view of a blank of a printed circuit board.
Figure 9:
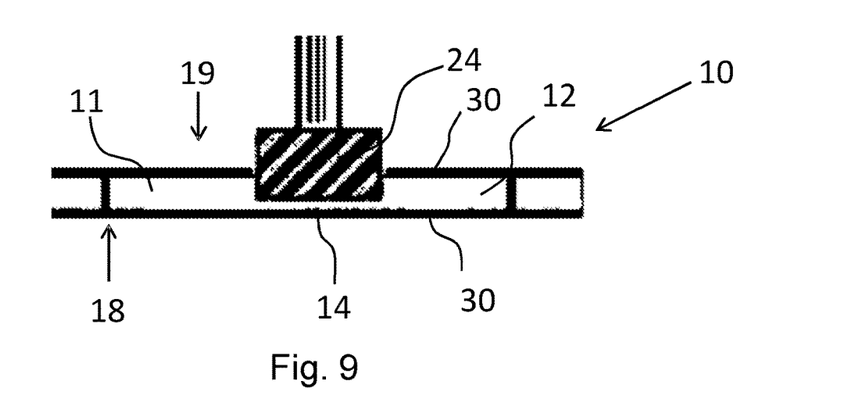
FIG. 9 shows schematically a side view of the blank of the printed circuit board according to FIG. 8 in a processing step.
Figure 10:
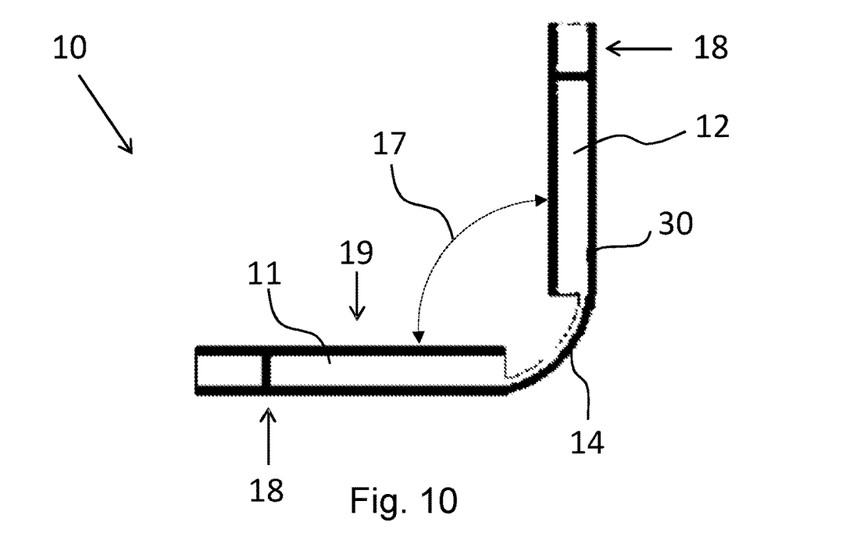
FIG. 10 shows schematically the printed circuit board according to FIGS. 8 and 9 provided with a deformation region.

FIGS. 8 to 10 show a method for providing a deformation zone 14 in a printed circuit board 10, wherein FIG. 8 shows a planar blank of a printed circuit board 10.

The blank of the printed circuit board 4 in FIG. 8 has a base plate 28 formed from an electrically insulating material and having a first side 18 and a second side 19. Conductive connections in the form of conductive tracks 30 are arranged on the base plate on both sides 18, 19. Furthermore, in the base plate 28 pins 32 or bores are provided, by which conductive tracks 30 on the first side 18 can be electrically conductively connected to conductive tracks 30 on the second side 19.

FIG. 9 shows schematically a sectional view of the blank of the printed circuit board 10 according to FIG. 8 in a processing step in which the blank is provided with a deformation zone 14 which divides the printed circuit board 10 into the first region 11 and the second region 12 of the printed circuit board 10. For production of the deformation zone 14 material is removed from the printed circuit board 10 by means of a milling tool 24 acting on the second side, so that the wall thickness of the printed circuit board 10 is smaller or thinner in the deformation zone 14 by comparison with the wall thickness in the regions alongside. In this case the printed circuit board 10 basically has a wall thickness of 1.5 mm. In the milled region of the deformation zone 14 the wall thickness is reduced to 0.25 mm. In this case the conductive tracks 30 on the first side 14 remain undamaged.

FIG. 10 shows schematically the printed circuit board 10 according to FIG. 9 provided with the deformation region 14, wherein the second region 12 is pivoted by an angle 17 of 90° relative to the first region 11 by a deformation in the form of a bend of the deformation zone 14. Because of the comparatively strongly tapered wall thickness of the deformation zone 14, the deformation zone 14 acts as a film hinge between the first region 11 and the second region 12.

Because of the small wall thickness and the separation of the conductive tracks 30 on the second side 19 in the deformation zone 14, the capacity for thermal conduction in the deformation zone 14 is greatly reduced by comparison with the first region 11 and second region 12, so that the deformation zone 14 thermally insulates the first region 11 and the second region 12 from one another at least partially or thermally decouples them from one another.

In addition, the width of the deformation zone 14 can be reduced in order to achieve a more pronounced thermal insulation effect. Thus, the width of the deformation zone 14, in this case the width of the film hinge, can be less than the width of the first region 11 and/or of the second region 12.

Figure 11:
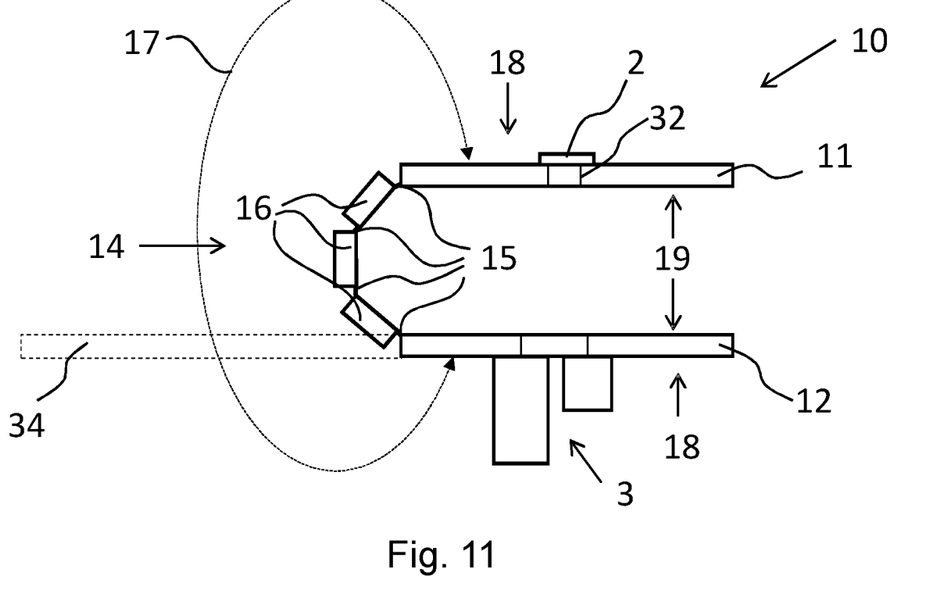
FIG. 11 shows schematically a sectional view of a printed circuit board according to a further embodiment.

FIG. 11 shows schematically a sectional view of a printed circuit board 10 according to a further embodiment. The printed circuit board 10 has a first region 11 and a second region 12. The two regions 11, 12 are connected by means of a connection zone 14, which has a plurality of rigid regions 16 and film hinges 15 arranged alternately adjacent to one another. The first region 11 is pivoted out of an initial state, which is indicated by means of the reference numeral 34, into an installation position in which the first region 11 and the second region 12 assume an angle 17 of 180° relative to one another.

The printed circuit board 10 in turn has a first side 18 and a second side 19, which are both provided with conductive tracks (not shown). The conductive tracks on the second side 19 extend continuously from the first region 11 via the connection zone 14 to the second region 12.

The light-emitting diode 2 and the electronic driver 3 are both arranged on the first side 18 of the printed circuit board 10 and are connected by means of pins 32 to the conductive tracks located on the second side 19, so that there is an electrical contact between the light-emitting diode 2 and the electronic driver 3.

Because the first region 11 and the second region 12 form an angle 17 of 180°, the light-emitting diode 2 and the electronic driver 3 face in opposite directions. In a developed projection of the three-dimensionally constructed printed circuit board 10 onto an imaginary plane, the light-emitting diode 2 and the electronic driver 3 are, however, arranged on the same side of the printed circuit board 10, in this case the first side 18. In this embodiment the printed circuit board 10 in the developed-projected state would have a shape like that of the printed circuit board 10 in the initial state 34.

Although the invention has been illustrated and described in greater detail by the depicted exemplary embodiments, the invention is not restricted thereto and other variations can be deduced therefrom by the person skilled in the art without departing from the scope of protection of the invention.

In general, "a" or "an" may be understood as a single number or a plurality, in particular in the context of "at least one" or "one or more" etc., provided that this is not explicitly precluded, for example by the expression "precisely one" etc.

Also, when a number is given this may encompass precisely the stated number and also a conventional tolerance range, provided that this is not explicitly ruled out.

If applicable, all individual features which are set out in the exemplary embodiments can be combined with one another and/or exchanged for one another, without departing from the scope of the invention.

LIST OF REFERENCES 100 light fixture
1 housing
2 light-emitting diode
3 electronic driver
4 contact wire
5 contact pin
6 adhesive
7 cooling element
70 cutout
72 collar
74 base surface
8 base
9 lens
90 pin
10 printed circuit board
11 first region
12 second region
120, 122 part
14 deformation zone
15 film hinge
16 rigid region
17 angle
18 first side
19 second side
20 tube
22 end cap
24 milling tool
26 longitudinal extent
28 base plate
30 conductive track
32 pin
34 initial state

The invention claimed is:

1. A light fixture comprising:
a printed circuit board received in a housing;
at least one light-emitting diode mounted on a first region of the printed circuit board; and
an electronic driver mounted on a planar second region of the printed circuit board;
characterized in that the first region is connected to the planar second region by a deformation zone of the printed circuit board formed in one-piece with the first region and the planar second region, wherein the first region and the planar second region are electrically contacted with one another by the deformation zone.

2. The light fixture according to claim 1, wherein the at least one light-emitting diode and at least a portion of the electronic driver are arranged on a same side of the printed circuit board.

3. The light fixture according to claim 1, wherein a position of the planar second region in relation to the first region is changeable by a stretching of the deformation zone.

4. The light fixture according to claim 1, wherein the planar second region is able to pivot by a deformation of the deformation zone relative to the first region.

5. The light fixture according to claim 1, wherein the deformation zone has a wall thickness which is smaller than at least one of a wall thickness of the first region and a wall thickness of the planar second region, wherein the deformation zone is of thin-walled construction by comparison with at least one of the first region and the planar second region.

6. The light fixture according to claim 5, wherein the deformation zone is a film hinge.

7. The light fixture according to claim 1, wherein the deformation zone provides a thermal insulation between the first region and the planar second region.

8. The light fixture according to claim 1, wherein the planar second region is arranged in such a way that shading of the at least one light-emitting diode by the electronic driver is prevented.

9. The light fixture according to claim 1, wherein in an installation position, the planar second region is positioned in relation to the first region in a direction towards a base of the light fixture.

10. The light fixture according to claim 9, wherein the planar second region is retained in the installation position by at least one contact element.

11. The light fixture according to claim 10, wherein the contact element includes at least one element selected from the group consisting of a contact wire, a contact pin, and a part of the housing.

12. The light fixture according to claim 10, wherein in the installation position, the planar second region is pressed against the at least one contact element due to a resetting tension of the deformation zone.

13. The light fixture according to claim 1, wherein:
the at least one light-emitting diode and a first portion of the electronic driver are arranged on a first side of the printed circuit board; and
a second portion of the electronic driver is arranged on an opposing second side of the printed circuit board.

14. The light fixture according to claim 1, wherein:
the first region extends substantially in a first plane perpendicular to a longitudinal extent of the light fixture; and
the planar second region extends substantially in a second plane that intersects the first plane at the deformation zone.

15. The light fixture according to claim 1, wherein a plane of the first region intersects a plane of the planar second region only at the deformation zone.

16. The light fixture according to claim 1, wherein:
the first region is generally annular in shape; and
the planar second region extends away from a plane of the first region from an interior edge of the first region.

17. The light fixture according to claim 1, wherein:
the planar second region comprises a first part and a second part; and
the first region is disposed between the first part and the second part and connected to at least one of the first part and the second part by the deformation zone.

18. A method for producing a light fixture, the method comprising:
constructing a planar printed circuit board which is provided at least on one side with conductive tracks and has a first region, a planar second region, and a deformation zone which is connected in one-piece to the first region and the planar second region and is arranged between the first region and the planar second region;
arranging at least one light-emitting diode in the first region of the printed circuit board and arranging an electronic driver, which is connected to the at least one light-emitting diode by the conductive tracks, on the planar second region of the printed circuit board;
deforming the deformation zone of the printed circuit board in such a way that the first region and the planar second region enclose an angle greater than 0° to less than 360°; and
inserting the deformed printed circuit board into a housing of the light fixture.

19. The method according to claim 18, wherein the first region and the planar second region enclose an angle greater than 0° to less than or equal to 180°.

20. The method according to claim 18, wherein the at least one light-emitting diode and at least a portion of the electronic driver are arranged on a same side of the printed circuit board.

* * * * *